US009024631B2

(12) United States Patent
Beach et al.

(10) Patent No.: US 9,024,631 B2
(45) Date of Patent: May 5, 2015

(54) TRANSPORT AND DETECTION OF SUPERPARAMAGNETIC PARTICLES BY NANOWIRE

(75) Inventors: Geoffrey Stephen Beach, Arlington, MA (US); Elizabeth Ashera Rapoport, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 626 days.

(21) Appl. No.: 13/297,059

(22) Filed: Nov. 15, 2011

(65) Prior Publication Data
US 2012/0126807 A1 May 24, 2012

Related U.S. Application Data

(60) Provisional application No. 61/413,805, filed on Nov. 15, 2010.

(51) Int. Cl.
G01R 33/02 (2006.01)
G01R 33/12 (2006.01)

(52) U.S. Cl.
CPC ............ *G01R 33/1276* (2013.01); *G01R 33/02* (2013.01); *Y10S 977/901* (2013.01); *Y10S 977/902* (2013.01); *Y10S 977/932* (2013.01); *Y10S 977/953* (2013.01); *Y10S 977/96* (2013.01)

(58) Field of Classification Search
CPC .............................. G01R 33/02; G01R 33/1276
USPC .......... 324/252, 244, 260; 977/953, 960, 901, 977/902, 932, 762, 773
See application file for complete search history.

(56) References Cited

U.S. PATENT DOCUMENTS

2003/0158474 A1* 8/2003 Scherer et al. ................ 600/409
2005/0079591 A1* 4/2005 Reich et al. ................ 435/173.1
2005/0128842 A1   6/2005 Wei
2007/0155025 A1* 7/2007 Zhang et al. ..................... 438/3

(Continued)

FOREIGN PATENT DOCUMENTS

GB         2465369        *  5/2010

OTHER PUBLICATIONS

Sun et al.,"Tuning the properties of magnetic nanowires", IBM Journal of Research and Development [online], Jan. 2005, [retrieved on Mar. 12, 2012], vol. 49, Iss. 1, pp. 79-102, retrieved from the Internet <URL: http://www.ieeexplore.ieee.org/xpl/freeabs_all.jsp?arnumber=5388859>.

(Continued)

*Primary Examiner* — Patrick Assouad
*Assistant Examiner* — Lamarr Brown
(74) *Attorney, Agent, or Firm* — Duane Morris LLP

(57) ABSTRACT

An apparatus, method and computer-readable medium configured to transport a constituent of fluid sample that binds to a functionalized magnetic particle. The apparatus includes a substrate connected to an input port, a magnetic nanowire, and either a temporally changing magnetic field generator or a spin-polarized current source. The magnetic nanowire is disposed in a surface of the substrate. The width and thickness of the magnetic nanowire are configured so that a domain wall propagating along the nanowire in response to the temporally changing magnetic field continuously couples to a superparamagnetic particle introduced into the input port.

21 Claims, 10 Drawing Sheets

(56) References Cited

U.S. PATENT DOCUMENTS

| | | |
|---|---|---|
| 2007/0292943 A1 | 12/2007 | Jacobson et al. |
| 2009/0001983 A1 | 1/2009 | Wittkowski |
| 2009/0085026 A1 | 4/2009 | Kim et al. |
| 2010/0032737 A1 | 2/2010 | Seol et al. |
| 2010/0223797 A1 | 9/2010 | Peczalsk |
| 2011/0286255 A1* | 11/2011 | Worledge et al. ............... 365/55 |
| 2012/0037236 A1* | 2/2012 | Bertacco et al. ............... 137/13 |
| 2012/0222940 A1* | 9/2012 | Ehresmann ................... 198/617 |

OTHER PUBLICATIONS

Allwood et al., "Magnetic Domain-Wall Logic", Science [online], Sep. 9, 2005, [retrieved on Mar. 13, 2012], vol. 309, No. 5741, pp. 1688-1692, retrieved from the Internet: <URL:http://www.sciencemag.org/content/309/5741/1688.abstract>.

International Search Report for PCT/US11/60843, mailed Apr. 3, 2012.

Written Opinion of the International Searching Authority for PCT/US11/60843, mailed Apr. 3, 2012.

* cited by examiner

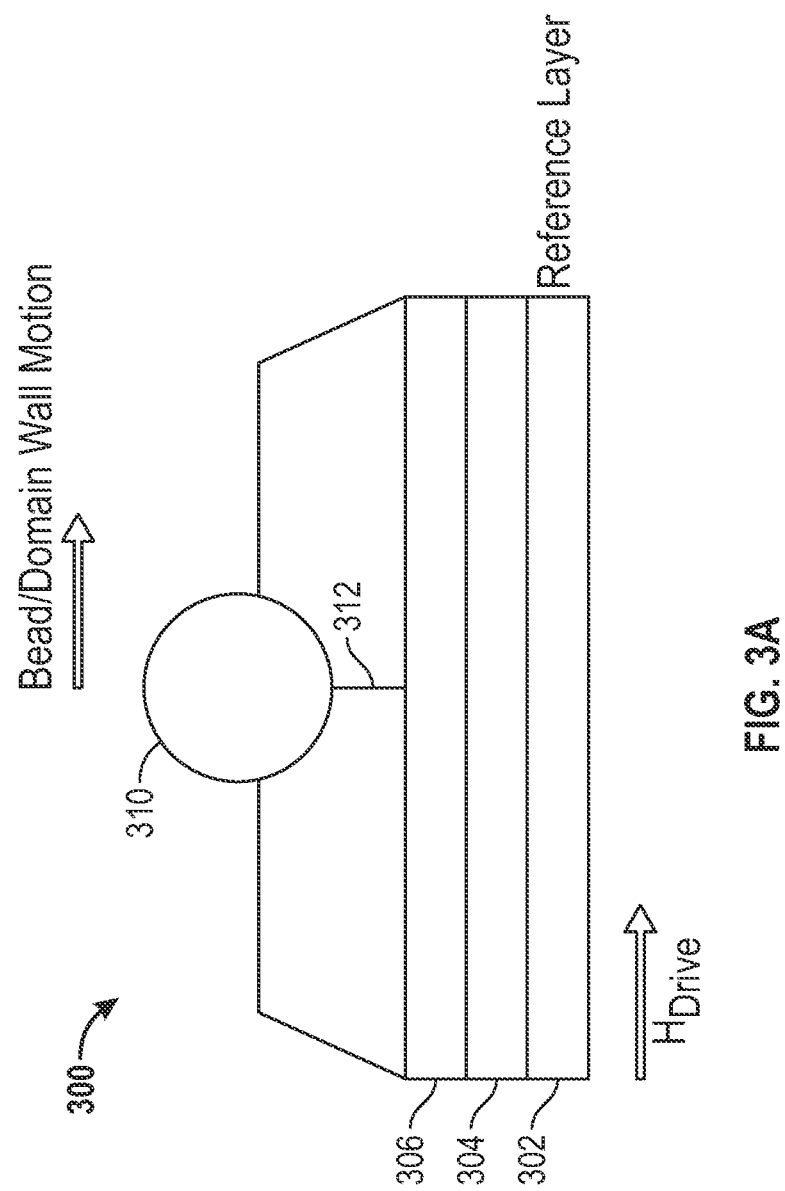

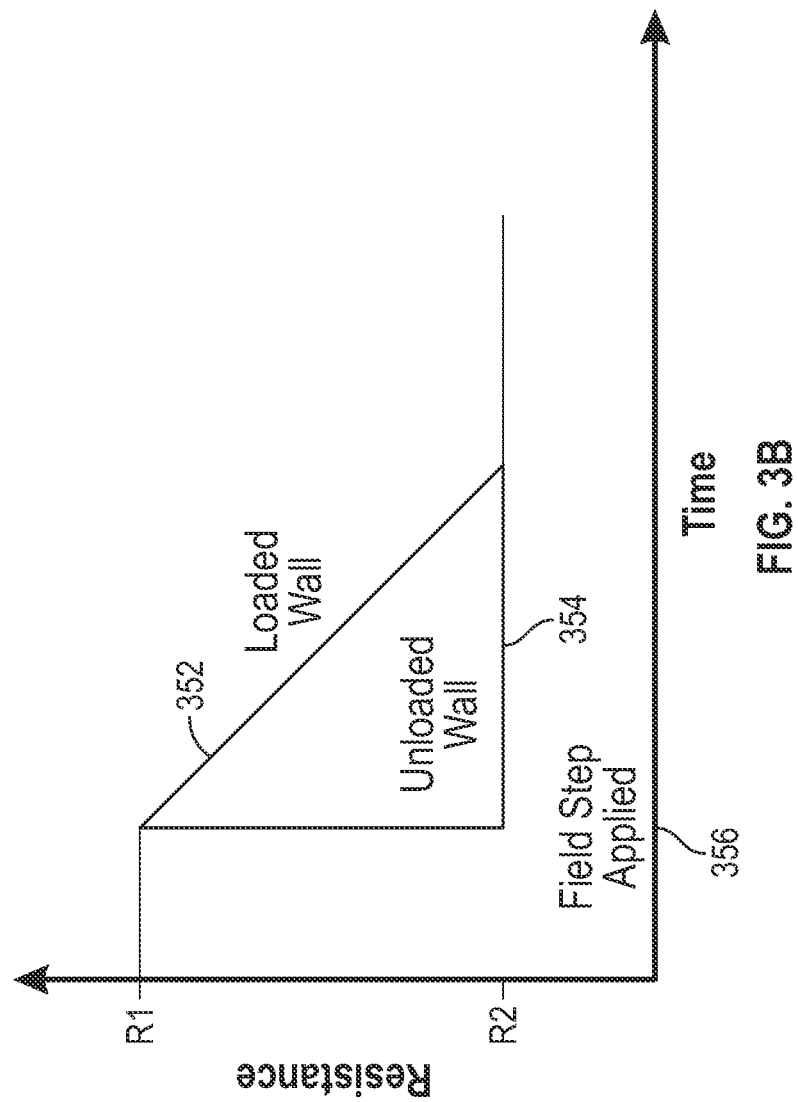

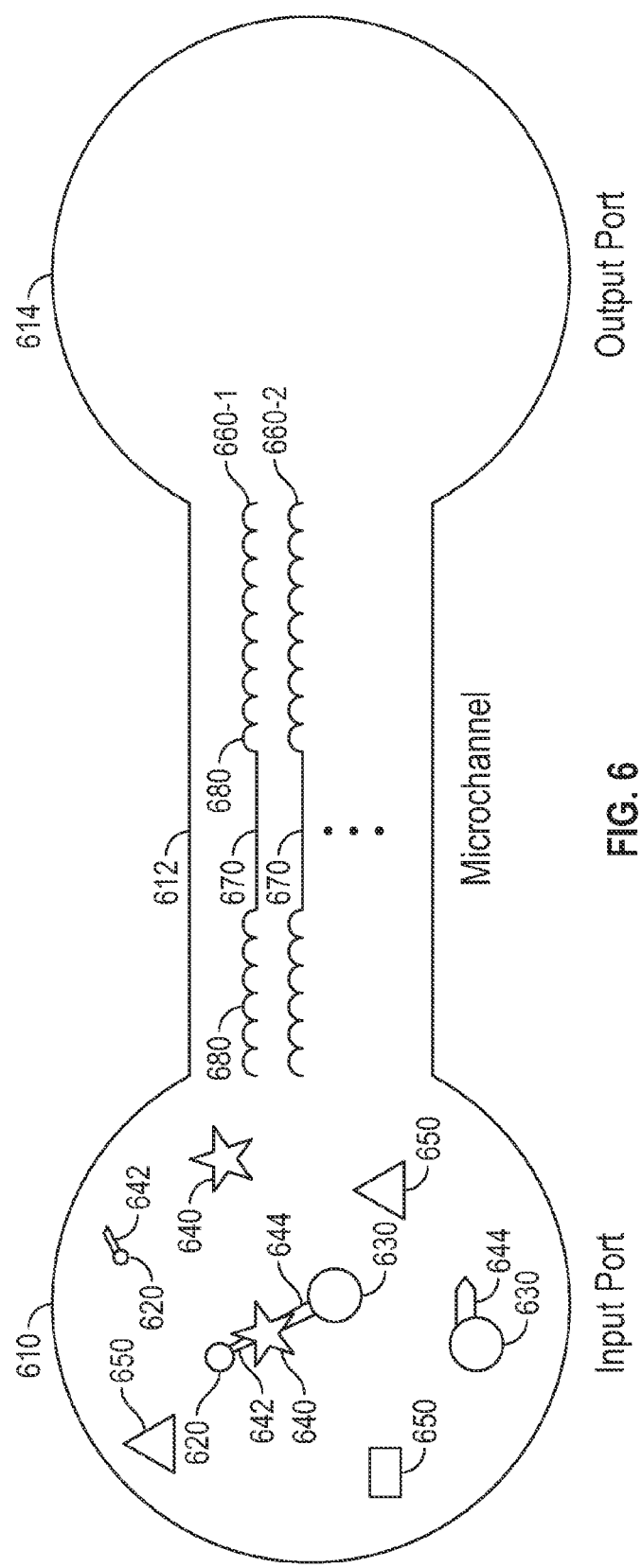

TRANSPORT AND DETECTION OF SUPERPARAMAGNETIC PARTICLES BY NANOWIRE

PRIORITY CLAIM

This application claims priority under 35 U.S.C. §119(c) from U.S. Provisional Pat. Ser. No. 61/413,805 entitled "High Speed Transport and Detection of Superparamagnetic Particles by Wire with Nanoscale Cross Section" filed Nov. 15, 2010, the entirety of which is hereby incorporated by reference herein.

STATEMENT OF GOVERNMENTAL INTEREST

This invention was made with Government support under Contract No. DMR-0819762 awarded by the National Science Foundation. The Government has certain rights in the invention.

BACKGROUND

Magnetophoresis is the motion of dispersed magnetic particles relative to a fluid under the influence of a magnetic field. The movement of magnetic particles can be used to detect or isolate specific components in the fluid, using specific binding and or capture. Such magnetic particles can be manipulated by applying an external field, which exerts a force in proportion to the gradient of the field. In most work to date, field gradients have been applied using macroscale (millimeter scale and larger, where 1 millimeter, mm, $=10^{-3}$ meters) electromagnet systems, or microscale (micrometer scale, where 1 micrometer, μm, also called a micron=$10^{-6}$ meters) lithographically-defined field-generating circuits. These approaches are inherently long-range and are difficult to scale down to single-particle control. Moreover, the large fields and field-gradients require several amps of current in field-generating circuits, posing a major challenge in device design, power dissipation, and heating.

Conventional systems for manipulating magnetic particles using magnetic field gradients have involved bench-top approaches requiring large, sophisticated machines. In addition to the power and heating issues associated with such conventional systems as described above, the cost of such systems has been high, and their speed has been low.

SUMMARY

An apparatus, method and computer-readable medium configured to transport a constituent of fluid sample that binds to a functionalized magnetic particle. The apparatus includes a substrate connected to an input port, a magnetic nanowire, and either a temporally changing magnetic field generator or a spin-polarized current source. The magnetic nanowire is disposed in a surface of the substrate. The width and thickness of the magnetic nanowire are configured so that a domain wall propagating along the nanowire in response to the temporally changing magnetic field continuously couples to a superparamagnetic particle introduced into the input port.

BRIEF DESCRIPTION OF THE DRAWINGS

The following will be apparent from elements of the figures, which are provided for illustrative purposes and are not necessarily to scale.

FIG. 3A is a schematic of a magnetoresistive sensor that may be patterned into a long planar conduit in accordance with some embodiments.

FIG. 3B is a plot of resistance over time for loaded and unloaded domain walls.

FIG. 6 is an illustration of a detection assay system in accordance with some embodiments.

DETAILED DESCRIPTION

Figure 1:
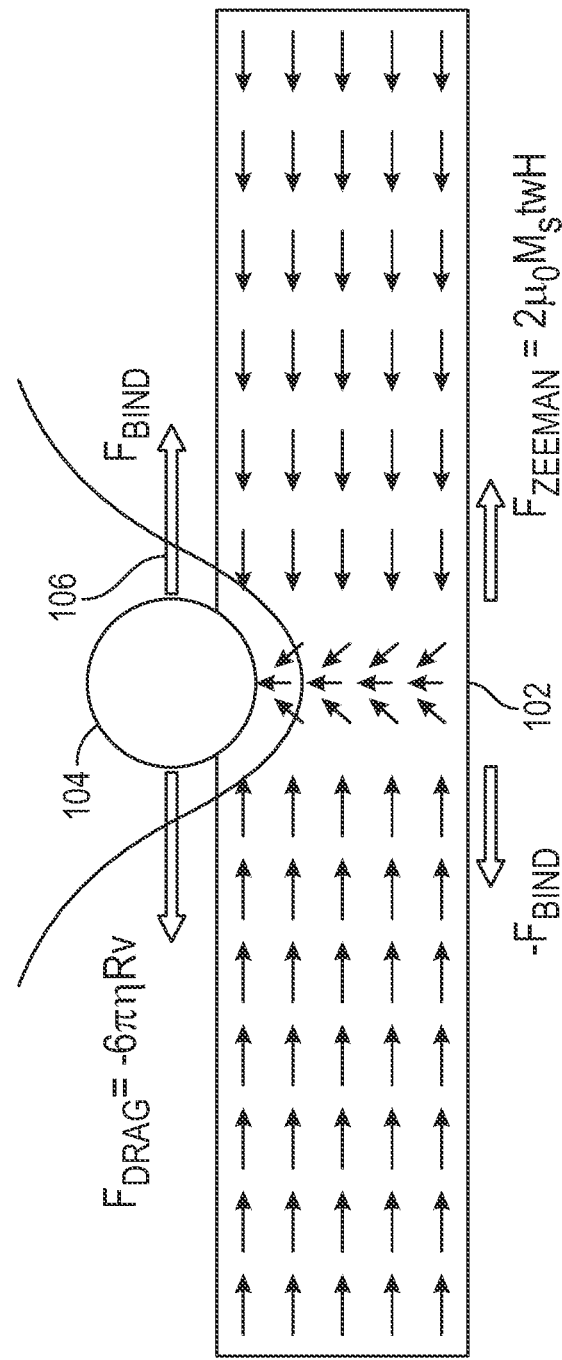
FIG. 1 is an illustration of forces involved in coupled domain wall/particle motion in accordance with some embodiments of the present disclosure.

This description of exemplary embodiments of the present disclosure is intended to be read in connection with the accompanying drawings, which are to be considered part of the entire written description. In this description, for the purposes of explanation, numerous specific details are set forth in order to provide a thorough understanding of various embodiments. It will be apparent, however, to one skilled in the art that various embodiments may be practiced without these specific details. In other instances, well-known structures and devices are shown in block diagram form in order to avoid unnecessarily obscuring the disclosure.

Methods and apparatuses are described for high speed transport and detection of superparamagnetic particles by wire with nanoscale cross section with the potential for detection of individual particles. For example, some embodiments of the present disclosure provide a novel approach for scaling down to the microchip level the precise manipulation of nanoparticles. In some embodiments, the highly localized stray magnetic field of magnetic domain walls in ferromagnetic nanowires is used as a mobile traps for capturing and transporting a particle. On-chip magnetic circuits are described for the controlled transport, sorting, and sensing of magnetic nanoparticles and magnetically-tagged specimens. This technology enables cheap, fast, and simple devices for medical diagnostics and chemical detection with nanoscale control and single-particle sensitivity.

Some embodiments of the present disclosure are described below in the context of biological assays using superparamagnetic nanoparticles (or magnetic beads including agglomerates of superparamagnetic nanoparticles) with a maximum dimension of 10 microns or less. However, embodiments are not limited to this context. In other embodiments, systems can be used for transport, filtering, or purification of organic or inorganic analytes, or some combination thereof, depending on the functionalization of the superparamagnetic particles of nanometer or micron scale or some combination.

Paramagnetism is a form of magnetism that occurs in the presence of an externally applied magnetic field. Paramagnetic materials are attracted to such applied magnetic fields. A superparamagnetic (SPM) material is magnetized by an externally applied magnetic field with a magnetic susceptibility much larger than that of a paramagnetic material. Superparamagnetic (SPM) properties are observed in ferromagnetic or ferrimagnetic nanoparticles.

A stationary or propagating transition in the orientation of magnetic moments of a ferromagnetic material is often confined to a spatially limited area called a magnetic domain wall (simply, a domain wall or DW hereinafter). A domain wall is the localized topological transition between two uniformly magnetized domains in a ferromagnet. As a domain wall is a local discontinuity in an otherwise uniform magnetic texture, a domain wall is magnetically charged and endowed with a localized stray field having a large gradient. A stray field is a magnetic field induced by moving electric charges or changing magnetic fields. Domain walls can form and propagate in response to a change in the magnitude or direction of an externally applied magnetic field or a spin-polarized current. The properties of a propagating domain wall are well predicted for a wire that is much longer than its width or thickness. As used herein, a nanowire refers to a metal strip of arbitrary length and having a thickness less than about 100 nanometers (nm, $1\ nm=10^{-9}$ meters) and width of a few microns or less. A magnetic nanowire refers to a magnetic metal strip of such dimensions.

As described in more detail below, for wires of magnetic material with a nanoscale cross section, such as nanowires, the magnetic gradients associated with the domain wall may be matched to capture a superparamagnetic particle. Furthermore, the resulting magnetic interactions slow the propagation speed of the domain wall. With appropriate selection of parameter values such as wire material, width, and thickness, and strength of an applied magnetic field, as described further below, the adjusted domain wall speed may be made to compensate for viscous drag on the particle, e.g., in the context of viscosity-limited propagation along extended straight-line continuous magnetic nanowire tracks. Thus, the particle may be captured ("trapped") and transported by the continuously-moving domain wall, unlike any approaches previously employed. Continuous transport may be implemented by a single domain wall, such that a particle is trapped and transported by a single potential well.

Domain Wall and Interaction with Superparamagnetic Particle

A domain wall is capable of a near-field interaction with nearby magnetically-susceptible objects. In particular, superparamagnetic (SPM) nanoparticles, or agglomerates of such particles, are drawn to regions of high magnetic field with a force in proportion to the gradient of the field. This magnetophoretic force is used to manipulate superparamagnetic particles in colloidal suspensions such as ferrofluids, or to manipulate surface-functionalized SPM particles bound to biological or chemical entities. Surface functionalization refers to engineering the surface of a particle with a particular chemistry (e.g., with a coating including molecules or binding agents) to develop a chemical affinity for a target species. Surface-functionalized magnetic nanoparticles have previously been used in macro-scale biological and chemical sorting and separation applications.

Found in bulk magnetic materials and thin films, domain walls are extended objects that behave stochastically as elastic lines in a disordered medium. However, by confining a domain wall in a narrow thin-film nanowire, narrow, particle-like domain walls can be stabilized and controlled using external magnetic fields or electrical currents passed through the wire, via spin-transfer torque. A nanowire may be a planar ferromagnetic strip of length L, width w, and thickness t, with L>>w>t. The width w may be several hundred nm, but possibly up to several microns, and the ratio w/t is typically about 10, with the thickness 1 about 5 to 100 nm. A magnetic field H along the wire length exerts an effective force on the wall, which force (discussed further below) tends to displace the domain wall along the wire.

The speed of domain walls propagating freely in magnetic nanowires is typically on the order of hundreds of meters per second (m/s). In order to avoid launching a domain wall forward while leaving behind a viscously-stuck SPM particle, domain wall-assisted transport has conventionally been limited to structures such as zig-zags and rings, where the magnetic field driving the domain wall was never applied parallel to a long, straight "straightaway" wire segment. The forces involved in viscosity-limited magnetic field-driven free-translation of tightly-bound DW/SPM particle pairs along nanowire straightaways are discussed below, including estimates of the maximum velocities that may be achieved and the conditions for achieving coupled translational dynamics.

The magnetostatic interaction between a DW and a SPM particle results in a local mutual potential well that can bind the two together. A SPM particle experiences a force in direct proportion to an applied magnetic field gradient. A domain wall responds to the field. The magnetic field along the wire length exerts an effective force on the wall proportional to the Zeeman energy difference on either side:

$$F_{Zeeman}=dU_{Zeeman}/dx=2\mu M_s twH, \quad (1)$$

where $U_{Zeeman}$ is the Zeeman energy, x is position along the length of the wire, $\mu_0$ is the permeability of free space, $M_s$ is the saturation magnetization, and H is the component of the applied field along the wire axis.

Under conditions that the DW-SPM pair remains bound (coupled) and translates together, its terminal velocity is determined by balancing the field-driven force with the viscous drag on the coupled pair. An isolated field-driven domain wall has a terminal velocity $v=\mu H$ (in the low-field regime), with $\mu=\gamma\Delta/\alpha$. Here, $\Delta$ is the domain wall width, $\gamma$ is the gyromagnetic ratio, and $\mu$ is the Gilbert damping coefficient. The domain wall mobility, $\mu$, is hence finite and limited by the finite damping coefficient $\alpha$. The domain wall motion can be phenomenologically described in terms of the balance between the Zeeman force on the domain wall and a magnetic viscosity given by:

$$\vec{F}_{viscous}^{magnetic} \approx -(2\mu_0 M_s tw\mu^{-1})\vec{v}, \quad (2)$$

Consider a 1 μm SPM bead bound to a domain wall in a 200 nm×40 nm. Permalloy nanowire. Permalloy refers to a nickel-iron magnetic alloy, typically with about 20% iron and 80% nickel content, and with a high magnetic permeability (μ), low coercivity, near zero magnetostriction, and high anisotropic magnetoresistance. For such a SPM bead bound to a domain wall, the ratio of the fluidic drag on the particle to the magnetic viscosity-induced drag on the domain wall is about $10^5$, so the fluidic drag determines the terminal velocity of the pair:

$$v = \frac{\mu_0 M_s t w}{3\pi \eta R} H \equiv \xi H, \quad (3)$$

where η is the dynamic viscosity of the fluid, R is the radius of the bead (or particle generally) and the second equality defines a "coupled mobility" parameter ξ.

For the particle/wire parameters in the running example, we estimate ξ≈1.3 (mm/s)/(A/m), or ~100 (μm/s)/Oe, where A represents Amperes of SI units and Oe represents Oersteds of cgs units. Hence, large particle velocities (e.g., 10-100 times higher than the highest velocities of magnetophoretic motion) may be achieved with a modest applied field, as long as the magnetostatic binding is sufficiently large.

FIG. 1 shows a coupling between a domain wall 102 and a particle 104. The magnetostatic interaction between the domain wall 102 and the particle 104 results in a local mutual potential well 106 that binds the two together. Since the driving Zeeman force and viscous drag act on the domain wall 102 and SPM particle 104, respectively, in dynamic equilibrium, they tend to pull apart. The viscous drag force is given by the Stokes form $\vec{F}_{drag} = -6\pi\eta R \vec{v}$ in the low Reynolds number regime, where η the dynamic viscosity of the fluid, R is the radius of the particle 104, and v is velocity. The larger the applied field, the faster the pair moves, and the further the particle 104 is shifted from the magnetostatic energy minimum. The displacement results in a restoring force $\vec{F}_{bind}$ (binding force) which, in dynamic equilibrium, obeys the relationship:

$$|\vec{F}_{bind}| = |\vec{F}_{Zeeman}| = |\vec{F}_{drag}|. \quad (4)$$

The binding force may range from tens to hundreds of picoNewtons (pN, 1 pN=$10^{-12}$ Newtons).

As long as the equalities in Eqn. (4) are satisfied, the coupled system moves at the terminal velocity given by Eqn. (3).

Thus, in some embodiments, a magnetic domain wall and a trapped particle are moved in unison by applying a directed force to the domain wall, rather than to the particle.

Physical Conditions and Calculations for Fast Coupled Transport.

In lithographically-fabricated micro- and nanowire guide structures, edge defects, roughness, and other inhomogeneities lead to domain wall pinning on defects. This results in a minimum magnetic driving field that is applied in order to displace the domain wall along the wire. Once that field threshold (depinning field) is reached, the domain wall moves forward at its viscosity-limited velocity. If the depinning field is larger than the maximum field that can be applied before the Zeeman force exceeds the maximum magnetostatic binding force, then as soon as the depinning field threshold is reached, the domain wall will move rapidly forward and leave the particle behind. Hence, it is a condition that the maximum effective binding field between the domain wall and the particle exceed the field threshold required to drive the domain wall through a structure. Typical domain wall depinning fields in magnetic thin-film micro- and nanowire structures are approximately 5 Oe to 30 Oe or higher.

In order to estimate the maximum velocities and maximum longitudinal driving fields possible for viscosity-limited long-range particle transport, micromagnetic simulations of domain wall structure have been combined with numerical integration of the resulting stray fields to compute magnetostatic binding potential energy surfaces. The computation of such potential energy surfaces enables the modeling of the interaction between domain walls and SPM particles over a matrix of wire cross sectional dimensions and bead diameters. The maximum binding force depends on the details of wire geometry, wall topology, and particle dimensions. The critical binding field, or maximum longitudinal drive field that can be applied before the particle and domain wall are separated, is calculated as 65 Oe for a 1 μm diameter SPM bead on a 200 nm wide by 40 nm thick Permalloy wire, corresponding to an estimated hydrodynamic velocity limit of about 8 mm/s.

Figure 2:
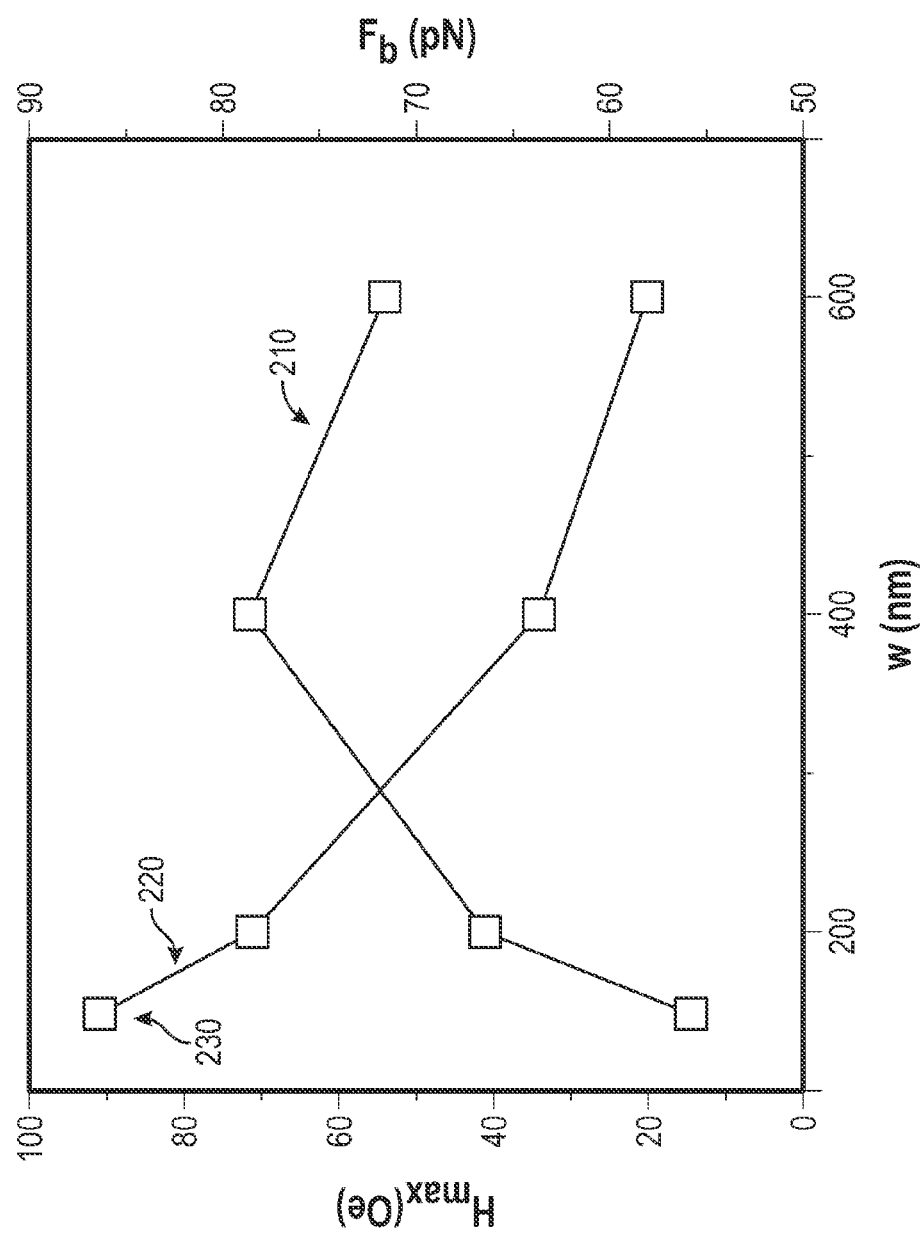
FIG. 2 is a plot of binding force and maximum magnetic field versus wire width in accordance with some embodiments.

FIG. 2 is a plot of binding force and maximum magnetic field versus wire width in accordance with some embodiments of the present disclosure. Plot 210 is the binding force $F_{bind}$ of Eqn. (4), labeled as $F_b$ in FIG. 2. Plot 220 is the maximum magnetic field $H_{max}$ that may be applied for coupled transport in accordance with some embodiments. FIG. 2, which corresponds to a 1 μm diameter SPM bead, shows that appropriate wire dimensions and bead size may be selected for fast, continuous transport of the bead. Noting that the condition for the domain wall and the SPM bead to move together in coupled transport is that $F_{bind}$ exceeds the Zeeman force $F_{Zeeman}$, and noting that $F_{Zeeman}$ scales with the wire geometry, the maximum magnetic field $H_{max}$ that may be applied is obtained as shown in FIG. 2. Point 230 corresponds to a velocity of about 8 mm/s.

The particle transport speeds achieved in some embodiments, on the order of millimeters per second, are several orders of magnitude faster than speeds previously achieved for magnetophoresis of superparamagnetic particles by conventional techniques.

Thus, single-particle velocities ranging from about 1-10 mm/s are achieved for micron-sized magnetic beads for magnetic fields on the order of 10 Oe, orders of magnitude smaller than those required for traditional magnetophoretic motion, and eliminating the need for an externally applied field gradient. Domain wall-based devices in accordance with various embodiments hence offer very fast single-particle transport over arbitrary magnetic tracks that can be implemented using standard lithography. As described below, this magnetically-based platform is easily integrated with magnetic-sensitive detection to provide new integrated functionalities in lab-on-chip applications. In some embodiments, components are integrated with existing microfluidics-based devices to enhance functionality, or combined to produce a completely domain-wall-actuated architecture for particle transport, meteorology, particle sorting, or some combination thereof.

Monitoring of Domain Wall Position and Velocity

The position and velocity of the domain wall (e.g., when coupled to a particle) may be monitored with a magneto-resistive material. A magneto-resistive material has an electrical resistance that depends on the orientation of the magnetic moments in the material.

FIG. 3A is a schematic of a magnetoresistive sensor 300 that may be patterned into a long planar conduit. Sensor 300 may include two magnetic (e.g., ferromagnetic) layers 302 and 306 separated by a nonmagnetic spacing layer 304. Layer 302 may be a magnetically "hard" reference layer whose magnetization remains fixed even in applied magnetic fields. Layer 306 may be a magnetically "soft" layer that responds to an external field, and motion of a domain wall 312 (and thus transport of a bead 310 coupled to the domain wall) may occur at this layer. Layer 304 may be an electrically conducting layer. The electrical resistance may attain a minimum when the magnetic moments in both magnetic layers are aligned in the same direction and may attain a maximum when those magnetic moments are oppositely directed. As the domain wall 312 propagates in the transport layer (free layer)

306, the resistance moves from near minimum to near maximum (or near maximum to near minimum). The velocity of the domain wall 312 may be determined by monitoring the change of the resistance over time. In some embodiments, the nanowire constitutes one of the two magnetic layers.

Thus, by constructing a nanowire conduit using this bilayer structure, domain wall motion occurs in the magnetically soft top layer 306, and the position and speed of the domain wall 312 can be monitored electrically. This can be used as a velocimetric sensor by monitoring the resistance in time. The rate of change of the resistance is proportional to the domain wall velocity, which varies dramatically between loaded (bound to a particle) and unloaded configurations. For a loaded domain wall, the velocity scales inversely with the viscosity of the particle, which provides a means to distinguish between variously-sized beads, or the size of their tethered bio-cargo.

FIG. 3B is a plot of resistance over time for a loaded domain wall (wall bound to a particle) and for an unloaded wall domain (wall not bound to a particle). Plot 352 shows resistance of the loaded wall, and plot 354 shows resistance of the unloaded wall. Initially, both walls are at resistance $R_1$. At time 356, a magnetic field step is applied. The resistance profile of the unloaded wall is a step function, as the resistance falls to level $R_2$. For the loaded wall, the resistance decreases gradually to $R_2$ as shown. The varying resistance profiles over time provide a basis for discriminating loaded from unloaded walls.

In some embodiments, the interaction between the functionalized bead (or particle) and the substrate is used as a measurable discriminating feature to determine the bead's surface properties. For example, in some embodiments, such an interaction is used to determine whether the particle surface is decorated with bound analytes (i.e., detect the presence of analytes), and to quantify their surface-coating density (i.e., determine the concentration of analytes), for a sensitive bio-assay using each individual bead as a reaction substrate. By applying different functional surfaces to superparamagnetic particles of different sizes subject to different viscous drag forces, different analyte species may be detected based on the distribution of speeds detected using the magneto-resistive material.

Figure 4:
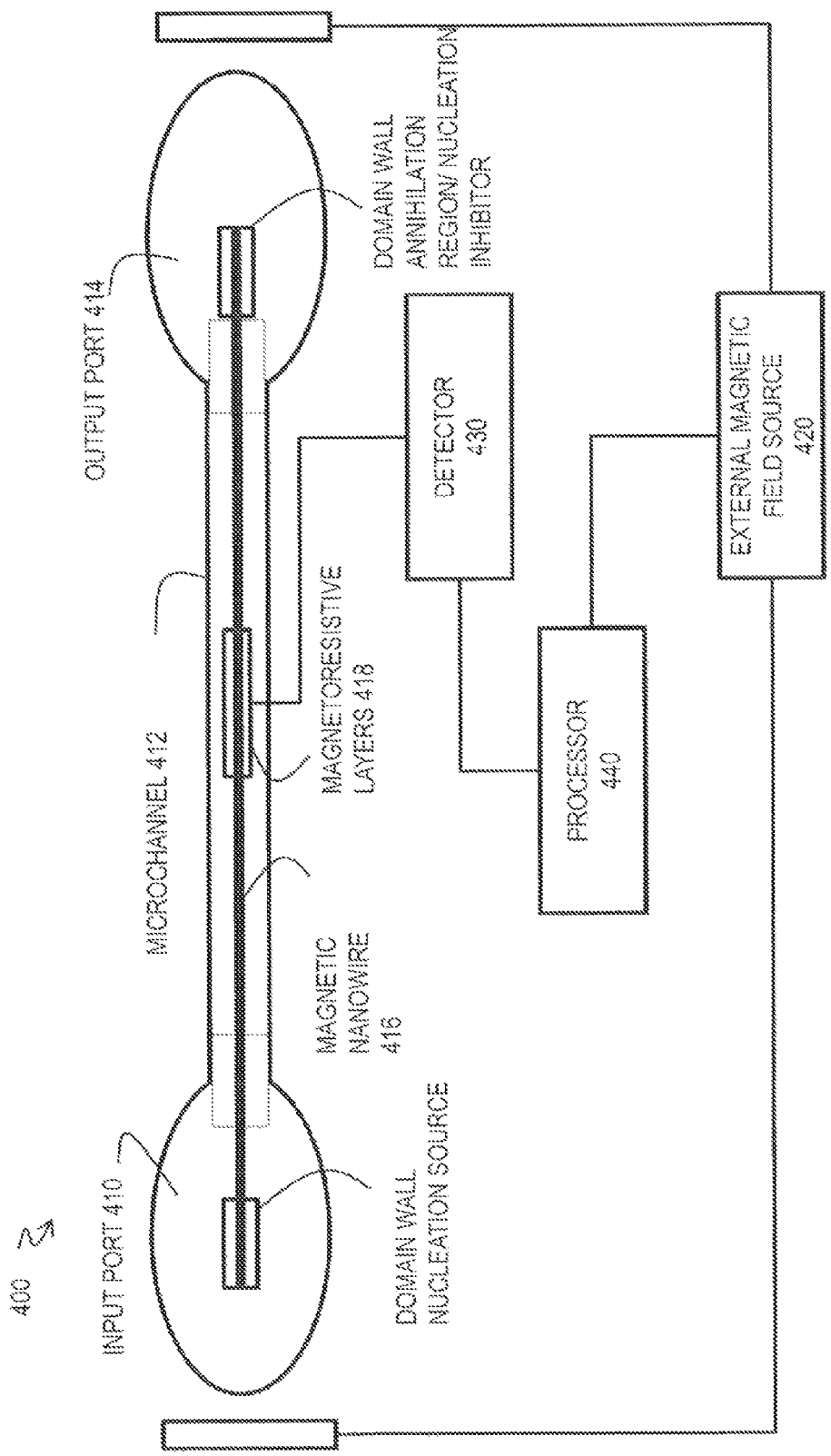
FIG. 4 is a block diagram that illustrates an example system for high speed transport, detection, and quantification of superparamagnetic particles in accordance with some embodiments.

FIG. 4 is a block diagram that illustrates an example system 400 for high speed transport, detection, and quantification of superparamagnetic particles in accordance with some embodiments. The system comprises an input port 410 connected to an output port 414 by a microchannel 412. A microchannel has a width and height each less than about 1000 microns. A sample with at least one size of superparamagnetic particles functionalized to bind with at least one analyte is introduced into the input port 410.

A least one magnetic nanowire 416 is disposed in a surface in the microchannel 412, such as the bottom surface of the channel. A domain wall generator is located near one end of the nanowire, for the purpose of nucleating at least one domain wall. The generator may take the form of a geometrically-engineered magnetic structure in which domain walls can be nucleated using an external magnetic field (such as a magnetic pad contiguous with one end of the nanowire), or spin-polarized current source. Alternatively, the generator may be a local magnetic field generating circuit, such as a current-carrying wire crossing the nanowire such that the Oersted magnetic field from the current-carrying wire creates a reversed magnetic domain in the nearby region of the magnetic nanowire. Multiple domain wall generators may be located along the structure. An external magnetic field source 420 is configured to induce at least one domain wall to propagate in the magnetic nanowire 416 from the vicinity of the input port 410 to the vicinity of the output port 414. The other end of the nanowire is designed with dimensions to preclude the formation of a magnetic domain that could move from the output port towards the input port, and to provide for the annihilation of a domain wall arriving from the input port end. An example of such design is a taper of the nanowire into a triangular point, which is a termination point. A linear magnetic field directed along the nanowire is depicted, but in other embodiments, a rotating magnetic field is induced in a wire with circular or semicircular segments, as described further below.

In some embodiments, such as transport and sorting, the magnetic particles are transported with the domain walls that propagate along the nanowire based on the viscous drag on the superparamagnetic particles. In some embodiments, the speed distribution is measured by including the other layers 418 of a magneto-resistive material below at least a portion of the nanowire 416. In this portion, the electrical resistance change with time indicates the velocity of each coupled domain wall and particle. A distribution of speeds can be measured over time that indicates the relative occurrence of the different sized particles, or different sized loads on the same sized particles. The resistance change is detected by sensor 430 and converted to velocity and load distributions by processor 440. In some embodiments, the processor 440 also controls the operation of the external magnetic field source 420.

Various architectures may be used for long-distance transport of a bound particle: Straight-segment tracks may be used for long-distance mobility-limited transport as described above, and stepping structures may also be used for external field-paced transport. Each architecture may be employed in a larger-scale multifunctional device platform.

The linear transport conduit represents the simplest design approach. In terms of device scaleup, a key benefit of this design is simple and inexpensive lithography, as optical interference lithography patterns a series of submicron lines over centimeters of substrate quickly and easily. Single or multiple parallel transport tracks with this base structure are implemented in various embodiments. By providing a domain wall nucleation source (e.g., geometrically-defined pad) at one end, a simple, a single-axis step constant magnetic field may be used to propel the domain wall and bound particle the full track distance, at speeds ranging from about 0.1 to 10 mm/s. In some embodiments, only one domain wall/particle pair moves during each field step cycle for each track.

Figure 5A:
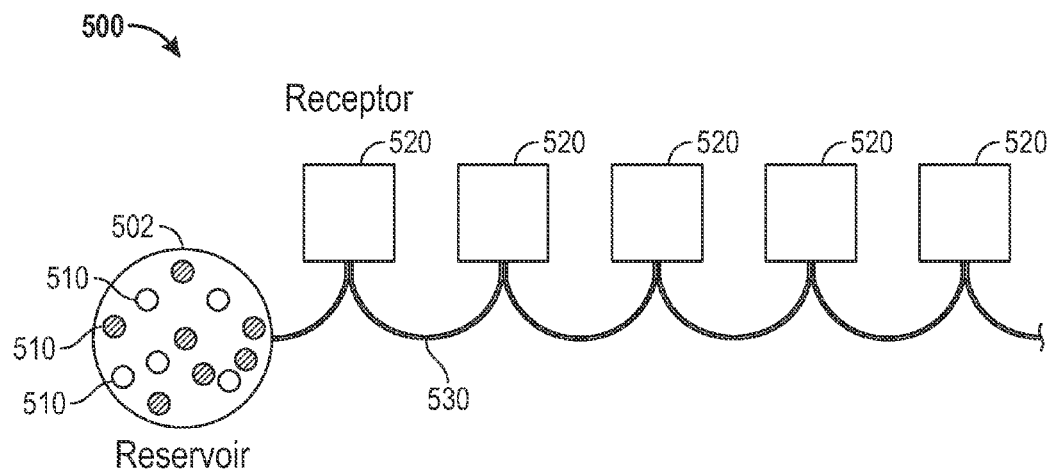
FIGS. 5A-5B show a transport geometry involving a rotating magnetic field that is used to inject a new magnetic domain wall into an undulating wire structure. 5A: starting state; 5B: after five half-cycles of the magnetic field.
Figure 5B:
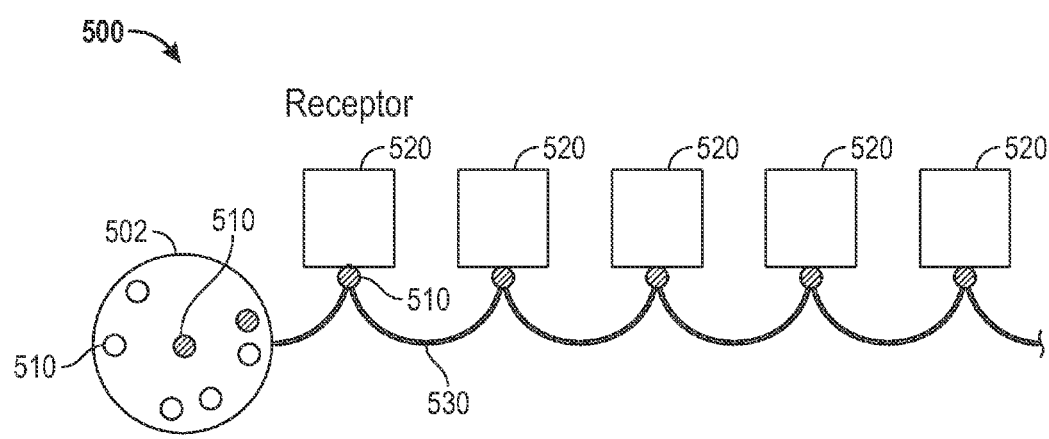

FIGS. 5A-5B show an alternative transport geometry. In structure 500, an in-plane rotating magnetic field is used to inject a new magnetic domain wall into an undulating wire structure 530 with each half-rotation, while advancing all other domain walls in the structure by one step. The undulating wire structure 530 may have a periodic, wave-like geometry. Each period of the wire structure may be semicircular in some embodiments. An arbitrary sequence of domain walls is transported in parallel (in pipelined fashion) along this structure. With a one-micron radius of curvature (for the example of a semicircular geometry), a 1 kHz rotating field causes this structure 530 to act as a domain wall conveyor belt that transports beads at 2 mm/sec. This architecture has the drawback of a more intricate lithographic step (although still simple in terms of lithography known to one of ordinary skill in the art), as well as a more complex magnetic drive field approach (rotating drive rather than linear drive). However, this architecture provides the benefits of the parallel motion of multiple, closely spaced domain walls and enables a transport speed that is precisely controlled by the clock frequency of the rotating magnetic field. Moreover, the applied field is never parallel to the motion direction in some embodiments, so long as the timescale of the applied field is below the relaxation time of domain wall dynamics (nanoseconds). Hence, the applied drive field does not tend to pull the domain wall away from the particle. This type of structure eliminates the constraint that the driving field remain lower than the wall-particle binding field.

FIG. 5A shows a starting state with nanoparticles 510 in a reservoir 502. A domain wall generates a stray field gradient that can capture nearby nanoparticles 510 from the reservoir 502. The nanoparticles are moved by driving the wall along wire 530. Certain particles 510 that are shown with diagonal stripes in FIGS. 5A and 5B may be magnetically tagged particles, e.g., magnetically tagged biological entities. A domain wall may follow a rotating magnetic field, moving up the circular arc of each semicircular component of wire structure 530 and then down. Each half-rotation of the magnetic field generates a domain wall in a magnetic pad (receptor) 520 and injects the wall into the undulating wire structure 530, where it continues to move following the rotating field. One magnetically tagged particle 510 maybe pulled from the reservoir 502 during each field cycle. After five half-cycles (for example), the particles 510 may be separated onto vertices of the wire 530 as shown in FIG. 5B. The motion of particles 510 may thus be precisely controlled, and the particles may be introduced to other particle sensor/transport components for further processing.

Velocimetric Approach for Biological and Chemical Assays

FIG. 6 is an illustration of a detection assay system 600 based on velocimetric sensing of magnetic beads and differentiating the binding state of the beads based upon the viscous drag term described above. In this example, a "sandwich assay" system is used, in which magnetic beads 620 and nonmagnetic load beads 630 are functionalized for binding to a specific target antigen 640. For example, the magnetic beads 620 and nonmagnetic load beads 630 may be decorated with detection antibodies 642 and 644, respectively, that are complementary to target antigen 640. Various non-target antigens 650 may be present as well. If target antigen 640 is present as shown in FIG. 6, the presence of that antigen leads to binding between magnetic beads 620 and nonmagnetic load beads 630 in proportion to the concentration of that antigen. Such a binding changes the effective hydrodynamic size and drag of the magnetic beads 620. A fluid specimen is mixed with the appropriate functionalized magnetic beads 620 and nonmagnetic beads 630, and the fluid specimen is loaded into the assay device.

Domain walls carry individual magnetic beads 620 along a track 660-1, 660-2, etc. (collectively, tracks 660) as described above, and in-line magnetoresistive sensors along straightaway segments 670 measure the viscosity-limited velocity to determine, on each field cycle, whether a particular domain wall is loaded with a magnetostatically-bound particle, and if so, the velocity and hence dynamic viscosity of the particle. Undulating segments 680 may be adjacent to the straightaway segments 670 as shown, and the tracks 660 may provide transport from an input port 610 to an output port 614 of assay system 600. Various numbers of tracks 660 may be used to provide parallelized assaying for high throughput.

The resulting velocity distribution of the dragged particles is used to determine the proportion of magnetic particles whose effective hydrodynamic radius has been altered by binding to the target antigen 640. Thus, the concentration of the target antigen 640 is determined in a digital fashion based on a change in size due to binding with load beads. The sensitivity is largely independent of concentration of the antigen 640, in contrast to conventional sensing assay systems that, if they are designed to maximize sensitivity, can overload at higher concentrations and hence have a relatively small working range of detectable concentrations.

In another embodiment, the binding of target molecules or chains themselves, without the bead, may lead to sufficiently different modification of the magnetic bead surface and its viscosity characteristics and/or interactions with the substrate that would influence the effective dynamical drag. By measuring the velocity and velocity distributions of domain wall-dragged magnetic beads, or beads dragged magnetophoretically through a fluid, the concentration of target molecules or bio-entities in the input fluid specimen can be measured over a high dynamic range or concentration, down to the limit of digital detection.

In some embodiments, multiple sets of magnetic beads 620 and/or nonmagnetic load beads 630 may be used for multiple assays on the same specimen simultaneously. In such a configuration, the actuation may be performed entirely using external magnetic fields, using integrated parallel domain wall-based transport conduits, with integrated velocimetric sensors, without the need for microfluidic pumps or other apparatuses. In addition, the sensing device itself may be non-specific, i.e., detection specificity is determined by the functionalization of the beads (which may be varied depending on the context), rather than of the sensors themselves, so the entire platform is generic and reconfigurable, unlike prior art assay systems.

Figure 7:
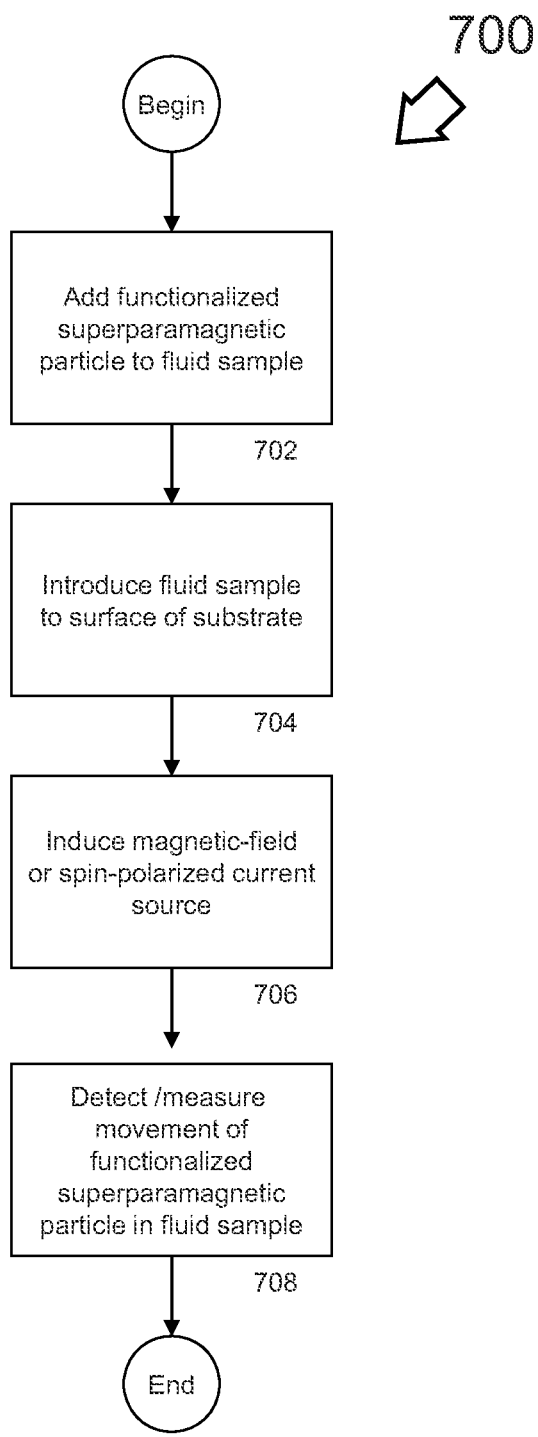
FIG. 7 is a flow diagram of a process in accordance with some embodiments.

FIG. 7 is a flow diagram of a process 700 in accordance with some embodiments. Initially, at block 702, a functionalized superparamagnetic particle is added to a fluid sample. The fluid sample with the contacted functionalized superparamagnetic particle is introduced into an apparatus comprising a magnetic nanowire disposed in a surface of a substrate and temporally changing magnetic field generator or spin-polarized current source, block 704. A domain wall is induced, and propagates along the nanowire, block 706. The domain wall transports a constituent of the fluid sample that binds to the functionalized superparamagnetic particle. In some embodiments, the width and thickness of the magnetic nanowire may be configured such that the domain wall continuously couples to the functionalized superparamagnetic particle. At block 708, sensors, such as magneto-resistive layer or optical sensor/camera, may determine a measure of the functionalized superparamagnetic particle based on a measured change in electrical resistance of the magneto-resistive layers.

In some embodiments, computer software or hardware is utilized to control the application of magnetic fields to induce the domain walls or to analyze the resulting speed distributions. Such process steps are implemented in a chip set or general purpose computer.

Figure 8:
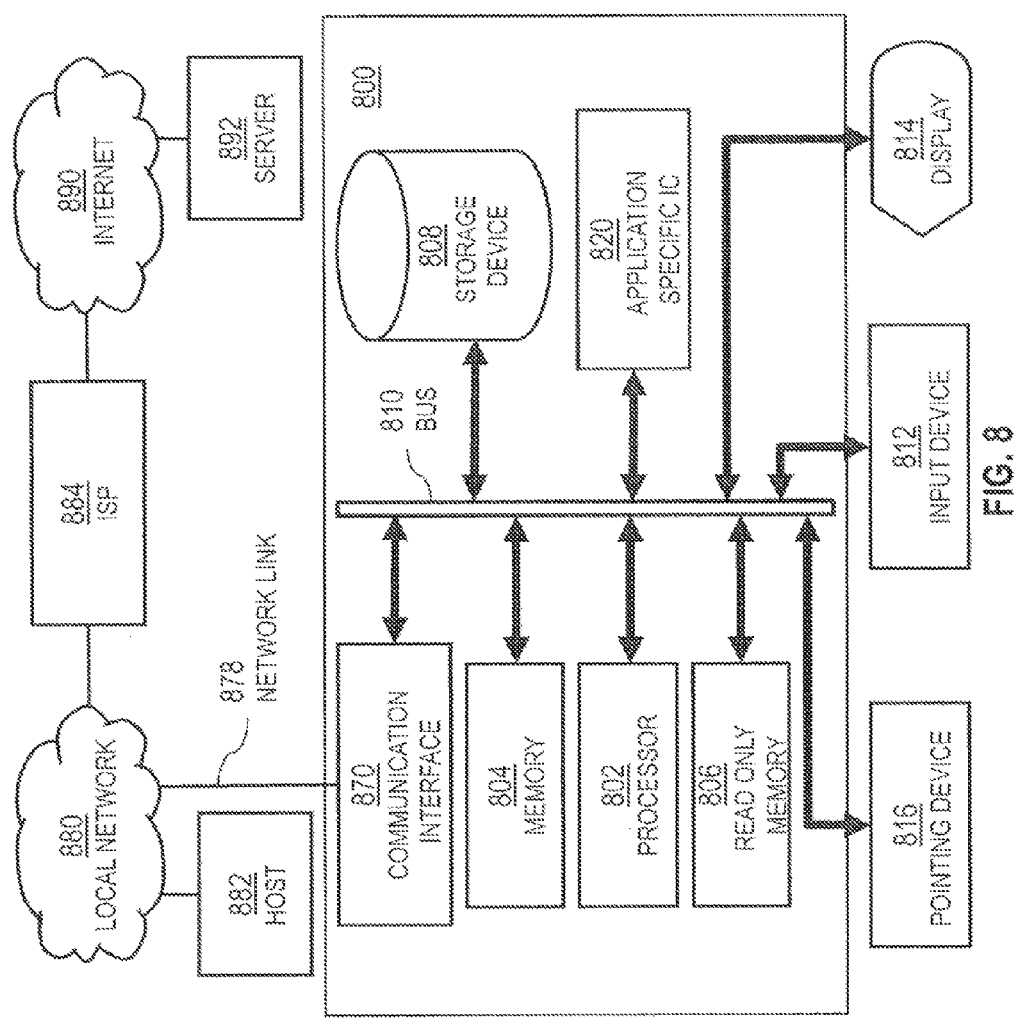
FIG. 8 is a block diagram that illustrates a computer system with which an embodiment of the present disclosure may be implemented.

FIG. 8 is a block diagram that illustrates a computer system 800 with which an embodiment of the present disclosure may be implemented. Computer system 800 includes a communication mechanism such as a bus 810 for passing information between other internal and external components of the computer system 800. Information is represented as physical signals of a measurable phenomenon, typically electric voltages, but including, in other embodiments, such phenomena as magnetic, electromagnetic, pressure, chemical, molecular atomic and quantum interactions. For example, north and south magnetic fields, or a zero and non-zero electric voltage, represent two states (0, 1) of a binary digit (bit). Other phenomena can represent digits of a higher base. A superposition of multiple simultaneous quantum states before measurement represents a quantum bit (qubit). A sequence of one or more digits constitutes digital data that is used to represent a number or code for a character. In some embodiments, information called analog data is represented by a near continuum of measurable values within a particular range. Computer system 800, or a portion thereof, constitutes a means for performing one or more steps of one or more methods described herein.

A sequence of binary digits constitutes digital data that is used to represent a number or code for a character. A bus 810 includes many parallel conductors of information so that information is transferred quickly among devices coupled to the bus 810. One or more processors 802 for processing information are coupled with the bus 810. A processor 802 performs a set of operations on information. The set of operations include bringing information in from the bus 810 and placing information on the bus 810. The set of operations also typically include comparing two or more units of information, shifting positions of units of information, and combining two or more units of information, such as by addition or multiplication. A sequence of operations to be executed by the processor 802 constitute computer instructions.

Computer system 800 also includes a memory 804 coupled to bus 810. The memory 804, such as a random access memory (RAM) or other dynamic storage device, stores information including computer instructions. Dynamic memory allows information stored therein to be changed by the computer system 800. RAM allows a unit of information stored at a location called a memory address to be stored and retrieved independently of information at neighboring addresses. The memory 804 is also used by the processor 802 to store temporary values during execution of computer instructions. The computer system 800 also includes a read only memory (ROM) 806 or other static storage device coupled to the bus 810 for storing static information, including instructions, that is not changed by the computer system 800. Also coupled to bus 810 is a non-volatile (persistent) storage device 808, such as a magnetic disk or optical disk, for storing information, including instructions, that persists even when the computer system 800 is turned off or otherwise loses power.

Information, including instructions, is provided to the bus 810 for use by the processor from an external input device 812, such as a keyboard containing alphanumeric keys operated by a human user, or a sensor. A sensor detects conditions in its vicinity and transforms those detections into signals compatible with the signals used to represent information in computer system 800. Other external devices coupled to bus 810, used primarily for interacting with humans, include a display device 814, such as a cathode ray tube (CRT) or a liquid crystal display (LCD), for presenting images, and a pointing device 816, such as a mouse or a trackball or cursor direction keys, for controlling a position of a small cursor image presented on the display 814 and issuing commands associated with graphical elements presented on the display 814.

In the illustrated embodiment, special purpose hardware, such as an application specific integrated circuit (IC) 820, is coupled to bus 810. The special purpose hardware is configured to perform operations not performed by processor 802 quickly enough for special purposes. Examples of application specific ICs include graphics accelerator cards for generating images for display 814, cryptographic boards for encrypting and decrypting messages sent over a network, speech recognition, and interfaces to special external devices, such as robotic arms and medical scanning equipment that repeatedly perform some complex sequence of operations that are more efficiently implemented in hardware.

Computer system 800 also includes one or more instances of a communications interface 870 coupled to bus 810. Communication interface 870 provides a two-way communication coupling to a variety of external devices that operate with their own processors, such as printers, scanners and external disks. In general the coupling is with a network link 878 that is connected to a local network 880 to which a variety of external devices with their own processors are connected. For example, communication interface 870 may be a parallel port or a serial port or a universal serial bus (USB) port on a personal computer. In some embodiments, communications interface 870 is an integrated services digital network (ISDN) card or a digital subscriber line (DSL) card or a telephone modem that provides an information communication connection to a corresponding type of telephone line. In some embodiments, a communication interface 870 is a cable modem that converts signals on bus 810 into signals for a communication connection over a coaxial cable or into optical signals for a communication connection over a fiber optic cable. As another example, communications interface 870 may be a local area network (LAN) card to provide a data communication connection to a compatible LAN, such as Ethernet. Wireless links may also be implemented. Carrier waves, such as acoustic waves and electromagnetic waves, including radio, optical and infrared waves travel through space without wires or cables. Signals include man-made variations in amplitude, frequency, phase, polarization or other physical properties of carrier waves. For wireless links, the communications interface 870 sends and receives electrical, acoustic or electromagnetic signals, including infrared and optical signals, that carry information streams, such as digital data.

The term computer-readable medium is used herein to refer to any medium that participates in providing information to processor 802, including instructions for execution. Such a medium may take many forms, including, but not limited to, non-volatile media, volatile media and transmission media. Non-volatile media include, for example, optical or magnetic disks, such as storage device 808. Volatile media include, for example, dynamic memory 804. Transmission media include, for example, coaxial cables, copper wire, fiber optic cables, and waves that travel through space without wires or cables, such as acoustic waves and electromagnetic waves, including radio, optical and infrared waves. The term computer-readable storage medium is used herein to refer to any medium that participates in providing information to processor 802, except for transmission media.

Common forms of computer-readable media include, for example, a floppy disk, a flexible disk, a hard disk, a magnetic tape, or any other magnetic medium, a compact disk ROM (CD-ROM), a digital video disk (DVD) or any other optical medium, punch cards, paper tape, or any other physical medium with patterns of holes, a RAM, a programmable ROM (PROM), an erasable PROM (EPROM), a FLASH-EPROM, or any other memory chip or cartridge, a carrier wave, or any other medium from which a computer can read.

Logic encoded in one or more tangible media includes one or both of processor instructions on a computer-readable storage media and special purpose hardware, such as ASIC 820.

Network link 878 typically provides information communication through one or more networks to other devices that use or process the information. For example, network link 878 may provide a connection through local network 880 to a host computer 882 or to equipment 884 operated by an Internet Service Provider (ISP). ISP equipment 884 in turn provides data communication services through the public, world-wide packet-switching communication network of networks now commonly referred to as the Internet 890. A computer called a server 892 connected to the Internet provides a service in response to information received over the Internet. For example, server 892 provides information representing video data for presentation at display 814.

Some embodiments of the present disclosure are related to the use of computer system 800 for implementing the techniques described herein. According to one embodiment, those techniques are performed by computer system 800 in response to processor 802 executing one or more sequences of one or more instructions contained in memory 804. Such instructions, also called software and program code, may be read into memory 804 from another computer-readable medium such as storage device 808. Execution of the sequences of instructions contained in memory 804 causes processor 802 to perform the method steps described herein, e.g., to implement process 700. In alternative embodiments, hardware, such as application specific integrated circuit 820, may be used in place of or in combination with software. Thus, embodiments are not limited to any specific combination of hardware and software.

The signals transmitted over network link 878 and other networks through communications interface 870 carry information to and from computer system 800. Computer system 800 can send and receive information, including program code, through the networks 880, 890 among others, through network link 878 and communications interface 870. In an example using the Internet 890, a server 892 transmits program code for a particular application, requested by a message sent from computer 800, through Internet 890, ISP equipment 884, local network 880 and communications interface 870. The received code may be executed by processor 802 as it is received, or may be stored in storage device 808 or other non-volatile storage for later execution, or both. In this manner, computer system 800 may obtain application program code in the form of a signal on a carrier wave.

Various forms of computer readable media may be involved in carrying one or more sequence of instructions or data or both to processor 802 for execution. For example, instructions and data may initially be carried on a magnetic disk of a remote computer such as host 882. The remote computer loads the instructions and data into its dynamic memory and sends the instructions and data over a telephone line using a modem. A modem local to the computer system 800 receives the instructions and data on a telephone line and uses an infra-red transmitter to convert the instructions and data to a signal on an infra-red a carrier wave serving as the network link 878. An infrared detector serving as communications interface 870 receives the instructions and data carried in the infrared signal and places information representing the instructions and data onto bus 810. Bus 810 carries the information to memory 804 from which processor 802 retrieves and executes the instructions using some of the data sent with the instructions. The instructions and data received in memory 804 may optionally be stored on storage device 808, either before or after execution by the processor 802.

Figure 9:
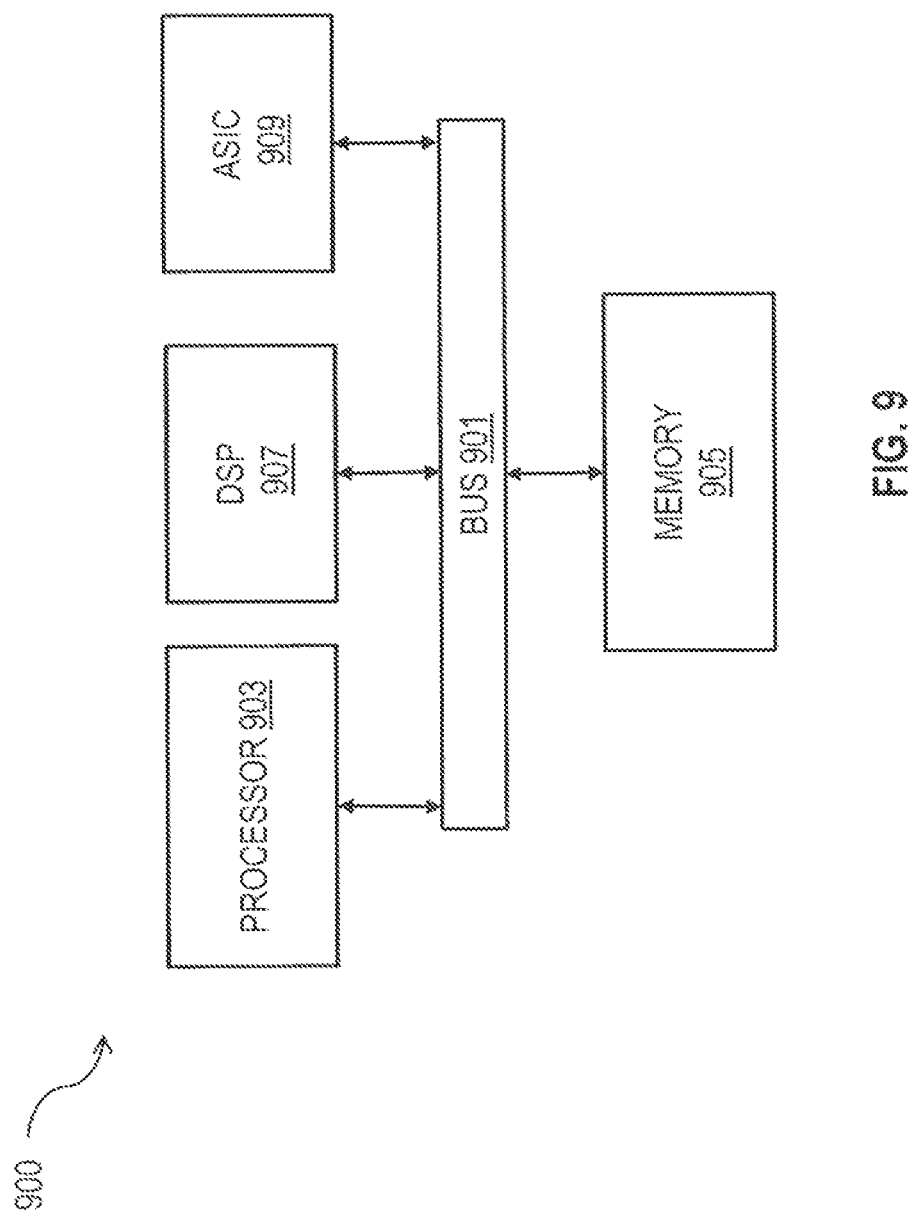
FIG. 9 illustrates a chip set upon which an embodiment may be implemented.

FIG. 9 illustrates a chip set 900 upon which an embodiment may be implemented. Chip set 900 is programmed to perform one or more steps of a method described herein and includes, for instance, the processor and memory components described with respect to FIG. 8 incorporated in one or more physical packages (e.g., chips). By way of example, a physical package includes an arrangement of one or more materials, components, and/or wires on a structural assembly (e.g., a baseboard) to provide one or more characteristics such as physical strength, conservation of size, and/or limitation of electrical interaction. It is contemplated that in certain embodiments the chip set can be implemented in a single chip. Chip set 900, or a portion thereof, constitutes a means for performing one or more steps of a method described herein.

In one embodiment, the chip set 900 includes a communication mechanism such as a bus 901 for passing information among the components of the chip set 900. A processor 903 has connectivity to the bus 901 to execute instructions and process information stored in, for example, a memory 9305. The processor 903 may include one or more processing cores with each core configured to perform independently. A multi-core processor enables multiprocessing within a single physical package. Examples of a multi-core processor include two, four, eight, or greater numbers of processing cores. Alternatively or in addition, the processor 903 may include one or more microprocessors configured in tandem via the bus 901 to enable independent execution of instructions, pipelining, and multithreading. The processor 903 may also be accompanied with one or more specialized components to perform certain processing functions and tasks such as one or more digital signal processors (DSP) 907, or one or more application-specific integrated circuits (ASIC) 909. A DSP 907 typically is configured to process real-world signals (e.g., sound) in real time independently of the processor 903. Similarly, an ASIC 909 can be configured to performed specialized functions not easily performed by a general purposed processor. Other specialized components to aid in performing the inventive functions described herein include one or more field programmable gate arrays (FPGA) (not shown), one or more controllers (not shown), or one or more other special-purpose computer chips.

The processor 903 and accompanying components have connectivity to the memory 905 via the bus 901. The memory 905 includes both dynamic memory (e.g., RAM, magnetic disk, writable optical disk, etc.) and static memory (e.g., ROM, CD-ROM, etc.) for storing executable instructions that when executed perform one or more steps of a method described herein. The memory 905 also stores the data associated with or generated by the execution of one or more steps of the methods described herein.

Although examples are illustrated and described herein, embodiments are nevertheless not limited to the details shown, since various modifications and structural changes may be made therein by those of ordinary skill within the scope and range of equivalents of the claims.

What is claimed is:

1. An apparatus comprising:
    a substrate connected to an input port;
    a magnetic nanowire disposed in a surface of the substrate; and
    a temporally changing magnetic field generator configured to generate a temporally changing magnetic field,
    wherein the width and thickness of the magnetic nanowire are configured so that a domain wall propagating along the nanowire in response to the temporally changing magnetic field continuously couples to a superparamagnetic particle introduced into a fluid via the input port so that the superparamagnetic particle is captured and transported through the fluid by the propagating domain wall.

2. The apparatus of claim 1, further comprising:
    sensors disposed adjacent to the nanowire, the sensors being configured to detect electrical resistance changes with passage of the domain wall through the nanowire.

3. The apparatus of claim 2, wherein the width and thickness of the magnetic nanowire are configured so that the domain wall continuously coupled to the superparamagnetic particle propagates at a speed greater than about 100 microns per second.

4. The apparatus of claim 3, wherein the sensors disposed adjacent to the nanowire are disposed in a straight lengthwise section of the nanowire.

5. The apparatus of claim 4, wherein the straight lengthwise section of the nanowire has a length in a range from about 5 microns to about 100 microns.

6. The apparatus of claim 5, wherein the sensors are magneto-resistive layers.

7. The apparatus of claim 5, wherein the sensors are optical cameras.

8. The apparatus of claim 3, wherein the sensors disposed adjacent to the nanowire are disposed in an undulating section of the nanowire with an undulating wire structure with each half-rotation.

9. The apparatus of claim 8, wherein the undulating section has a radius of curvature between one micron to twenty microns.

10. The apparatus of claim 9, wherein the sensors are magneto-resistive layers.

11. An apparatus comprising:
a substrate connected to an input port;
a magnetic nanowire disposed in a surface of the substrate; and
an electric current source configured to generate a spin-polarized electric current,
wherein the width and thickness of the magnetic nanowire are configured so that a domain wall propagating along the nanowire in response to the spin-polarized electric current continuously couples to a superparamagnetic particle introduced into a fluid via the input port so that the superparamagnetic particle is captured and transported through the fluid by the propagating domain wall.

12. A method comprising:
introducing a fluid sample with a contacted functionalized superparamagnetic particle into an apparatus comprising a magnetic nanowire disposed in a surface of a substrate and temporally changing magnetic field generator;
inducing a domain wall that propagates along the nanowire so that the superparamagnetic particle is captured and transported through the fluid sample by the propagating domain wall.

13. The method of claim 12, wherein the width and thickness of the magnetic nanowire are configured so that the domain wall continuously couples to the functionalized superparamagnetic particle.

14. The method of claim 13, wherein the domain wall transports a constituent of the fluid sample that binds to the functionalized superparamagnetic particle.

15. The method of claim 14, wherein the apparatus further comprises magneto-resistive layers exhibiting electrical resistance changes with passage of the domain wall through the nanowire.

16. The method of claim 15 further comprises:
determining a measure of the functionalized superparamagnetic particle based on a measured change in electrical resistance of the magneto-resistive layers.

17. The method of claim 16, wherein the domain wall propagates continuously with the coupled particle.

18. A method comprising:
introducing a fluid sample with a contacted functionalized superparamagnetic particle into an apparatus comprising a magnetic nanowire disposed in a surface of a substrate and spin-polarized electric current source;
inducing a domain wall that propagates along the nanowire, so that the superparamagnetic particle is captured and transported through the fluid sample by the propagating domain wall.

19. The method of claim 18, wherein the width and thickness of the magnetic nanowire are configured so that the domain wall continuously couples to the functionalized superparamagnetic particle.

20. The method of claim 19, wherein the domain wall transports a constituent of the fluid sample that binds to the functionalized superparamagnetic particle.

21. The apparatus of claim 8, wherein the nanowire has two undulating sections joined by a straight section having a length in a range from about 5 microns to about 100 microns.

* * * * *